United States Patent [19]

Kellen

[11] 4,149,102

[45] Apr. 10, 1979

[54] PIEZOELECTRIC MONOLITHIC CRYSTAL ELEMENT HAVING IMPROVED RESPONSE

[75] Inventor: Robert A. Kellen, Arlington Heights, Ill.

[73] Assignee: Motorola, Inc., Schaumburg, Ill.

[21] Appl. No.: 846,851

[22] Filed: Oct. 31, 1977

[51] Int. Cl.² ............................................. H01L 41/10
[52] U.S. Cl. ....................................... 310/320; 310/366
[58] Field of Search ................................. 310/366, 320

[56] References Cited

U.S. PATENT DOCUMENTS

| | | | |
|---|---|---|---|
| 3,382,381 | 5/1968 | Horton | 310/320 |
| 3,659,123 | 4/1972 | Oya | 310/320 X |
| 3,676,724 | 7/1972 | Berlincourt et al. | 310/320 X |
| 3,898,489 | 8/1975 | Grady et al. | 310/366 |

Primary Examiner—Mark O. Budd
Attorney, Agent, or Firm—James W. Gillman; Victor Myer

[57] ABSTRACT

A piezoelectric monolithic crystal filter operating in the trapped energy mode and having a capacitor plated on the piezoelectric wafer within energy coupling distance of the main electrodes has its output response improved by trapping wave energy, at the frequencies of the main electrodes, engendered by the capacitor and conducting such energy to the edges of the piezoelectric wafer where it is dissipated. Such energy is therefore not coupled into the filter structure and does not appear as an undesirable response.

1 Claim, 5 Drawing Figures

U.S. Patent    Apr. 10, 1979    4,149,102
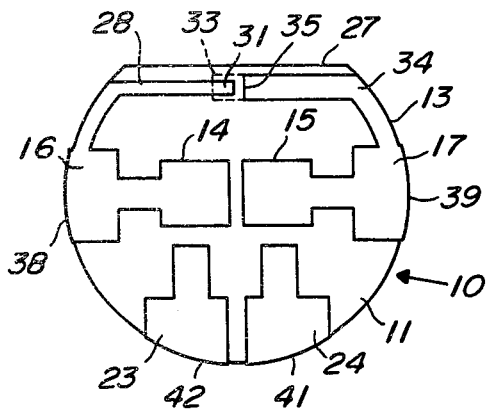
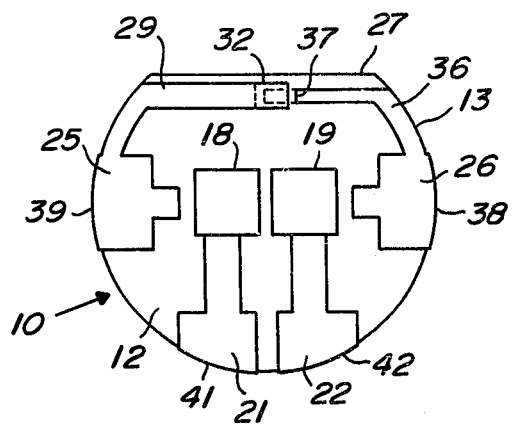
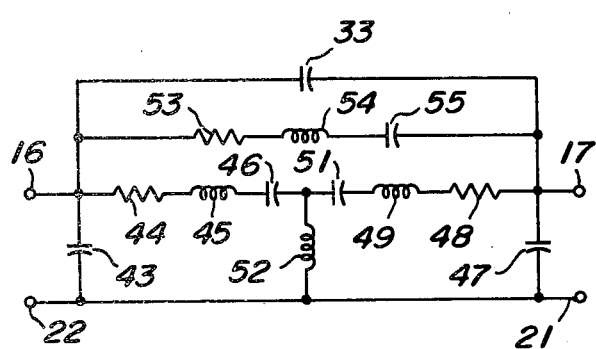
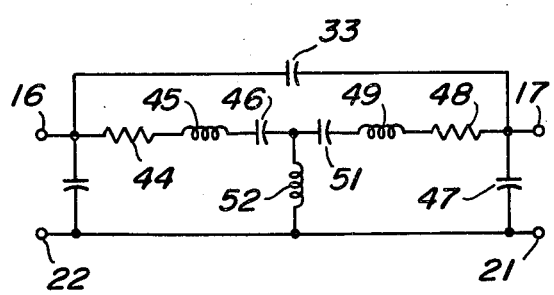
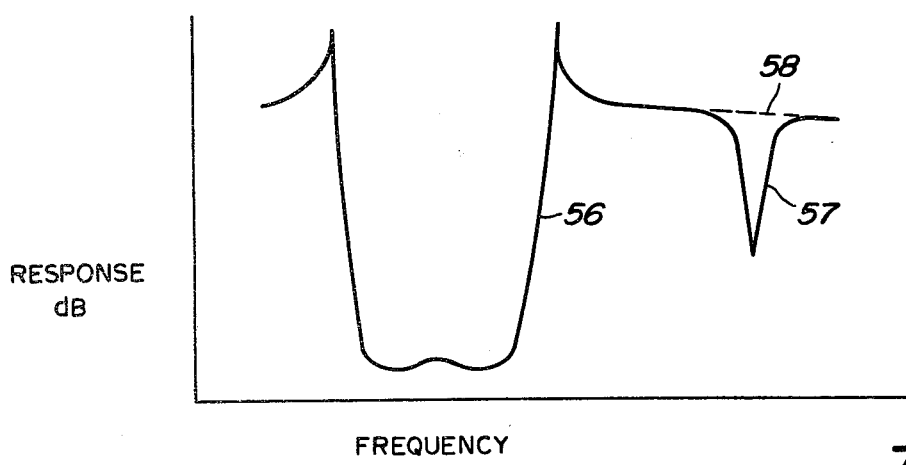

PIEZOELECTRIC MONOLITHIC CRYSTAL ELEMENT HAVING IMPROVED RESPONSE

BACKGROUND OF THE INVENTION

This invention relates to a piezoelectric monolithic crystal device, filters, resonators or the like, operating in the trapped energy mode and having a capacitor plated on the piezoelectric wafer within energy coupling distance of the main electrodes and it is an object of the invention to provide an improved device of this nature.

Piezoelectric monolithic crystal devices of the nature here involved are known to the art, as for example in the U.S. Pat. No. 3,898,489, Aug. 5, 1975 to John J. Grady and Theodore E. Lind and assigned to the same assignee as the present invention. As disclosed in the Grady et al patent electrodes are plated on the major surfaces of a piezoelectric crystal wafer, for example, AT cut quartz. The dimensions of the electrodes and those of the crystal wafer were selected, together with the frequency, so that the device whether acting as a filter, resonator, or the like, was operating in the trapped energy mode.

Conducting tabs connected to the electrodes on the appropriate surfaces of the crystal wafer were provided, and on the opposite sides of the crystal wafer from the conducting tabs there were provided pseudo tabs opposite the conducting tabs but terminating short of the actual electrodes for trapping spurious modes propagating within the crystal structure and conducting them to the edges of the crystal wafer for dissipation. Such spurious modes, accordingly, did not appear in the output response.

Connecting capacitors across the input and output electrodes of a monolithic crystal filter element for improving filter response also is well-known. In this respect, reference is made to the following U.S. Pat. Nos.: 3,947,784, Mar. 30, 1976 Arvanitis et al, 3,716,808, Feb. 13, 1973 Malinowski et al and 3,633,134, Jan. 4, 1972 Barrows et al all assigned to the assignee of the present invention. The capacitors illustrated in the patents referred to are not capacitors whose electrodes are plated onto the piezoelectric cyrstal surface but are separate, discrete, capacitors connected to the terminals as shown. However, it is also known to plate capacitor electrodes on the major surfaces of the piezoelectric element and connecting the capacitor electrodes to the input and output terminals. In such structures, though, the plated capacitor has been disposed far enough away from the main electrodes so that any frequency modes that were propagated in the piezoelectric material by virtue of the exitation of the capacitor did not couple to the main electrodes and thus did not produce any undesirable responses in the filter output. Thus such structures require relatively large piezoelectric crystal wafers in order to provide sufficient distance between the plated capacitor and the plated main electrodes to avoid any of the indicated coupling. Accordingly, such piezoelectric monolithic devices resulted in relatively large structures that were expensive in and of themselves and increased the cost by virtue of requiring larger packages. Moreover, it is essential that the device and the resulting package be made as small as possible.

SUMMARY OF THE INVENTION

It is an object of the present invention to provide an improved piezoelectric monolithic crystal resonator, filter, or the like, that substantially eliminates the defects of the prior art.

It is a further object of the invention to provide an improved piezoelectric monolithic crystal device of relatively small size, operating in the trapped energy mode and having a monolithic capacitor plated on the piezoelectric wafer and whose location is generally within the energy coupling distance of main mode frequencies propagated within the crystal wafer by the exitation of the capacitor, that prevents such coupling into the output response of the device.

It is a further object of the invention to provide an improved device of the character indicated wherein the energy propagated by the plated capacitor is trapped in the crystal area adjacent the capacitor and is conducted away therefrom to the edges of the crystal element.

In carrying out the invention according to one form there is provided a piezoelectric monolithic crystal device such as a filter or resonator, including a piezoelectric wafer having two major surfaces and a surrounding edge, a pair of spaced apart electrodes fixedly positioned in overlying relationship on each of the two major surfaces, the electrodes of each of said pairs on opposite ones of said major surfaces being approximately co-extensive and providing a main frequency of operation, a pair of electrically conducting tabs fixedly positioned in overlying relationship on each of the major surfaces and extending, respectively, from electrical connection with respective ones of the electrodes on each of the respective major surfaces outwardly to the surrounding edge of the major surface, the conducting tabs on opposite ones of the major surfaces extending outwardly to the surrounding edge in different directions so substantially no portions thereof are directly opposite each other, a pair of pseudo tabs positioned in overlying relationship on each of the major surfaces approximately co-extensive with and directly opposite, respectively, each of the conducting tabs, the pseudo tabs being spaced from the electrodes a distance sufficient to allow propagation of the spurious modes between the conducting tabs and the pseudo tabs toward the outer edge of the wafer while decoupling substantial propagation of the main mode, and conducting means for connecting cooperating ones of the connecting tabs and pseudo tabs on opposite ones of the major surfaces, comprising capacitor means including first and second capacitor plates plated one on each one of the two major surfaces, the first capacitor plate being coupled to one of the spaced apart electrodes and the second capacitor plate being coupled to the other one of the pair of electrodes, the capacitor being disposed within the energy coupling distance of the spaced apart electrodes, and means for preventing trapped energy of the capacitor means from coupling into the resonant system of the spaced apart electrodes.

In carrying out the invention according to a more specific form, the trapped energy generated by the capacitor itself is prevented from reaching the main electrodes by providing further electrodes on the opposite surface of the crystal wafer from the electrodes connected to the capacitor plates in order to retain between the further conducting leads and the leads to the capacitor plates the indicated trapped energy and conducting it away from the main electrodes, such for example, as to the edge of the crystal where it may be dissipated in any well-known means. The ends of the further leads are terminated as closely as possible to the other plates of the capacitor without contacting them, in order to retain and conduct away substantially all of the energy trapped by the plated capacitor.

BRIEF DESCRIPTION OF THE DRAWINGS

FIG. 1 is a plan view of one side of a piezoelectric monolithic crystal device according to the invention;

FIG. 2 is a plan view of the opposite side of the device illustrated in FIG. 1.

FIG. 3 is a circuit diagram representing components of the structure illustrated in FIGS. 1 and 2 but not incorporating the invention;

FIG. 4 is a similar circuit diagram of inventive devices; and

FIG. 5 is a typified frequency response curve illustrating operation with and without the invention.

DESCRIPTION OF THE PREFERRED EMBODIMENT

Referring to FIGS. 1 and 2, a circular segmental piezoelectric wafer 10 is illustrated as having a first major surface 11 and an opposite major surface 12 with a connecting edge 13 therearound.

The wafer 10 may be an AT cut quartz crystal or any other appropriate type of cut made from quartz or other types of piezoelectric material and while a circularly segmental shape has been shown it will be understood that other shapes may be used.

The first surface 11 of the wafer 10 has a pair of electrodes 14 and 15 affixed thereto in overlying relationship by some convenient method, such as plating, or the like. The electrodes 14 and 15 are applied in accordance with well understood wave trapping criteria to provide optimum spurious frequency mode suppression. Further, the electrodes 14 and 15 lie along a line parallel to the X crystallographic axis of the quartz forming the wafer and are spaced apart along the X axis a distance sufficient to allow coupling of the main frequency mode therebetween.

An electrically connecting tab 16 is plated onto the surface 11 in connection with the electrode 14 and extends outwardly to the edge 13. A second electrically conducting connecting tab 17 is plated on the surface 11 in connection with the electrode 15 and extends outwardly to the edge 13. The connecting tabs 16 and 17 extend radially outwardly along the X axis from the electrodes 14 and 15 in opposite directions on the surface 11. The particular configuration of the connecting tabs 16 and 17 was chosen so that the overall area of each of the connecting tabs is approximately equal to the area of each of the electrodes 14 and 15.

Referring to FIG. 2, the surface 12 of wafer 10 has a pair of electrodes 18 and 19 fixedly positioned in overlying relationship thereon, by some means such as plating, or the like. Electrode 18 is directly opposite and approximately co-extensive with electrode 15 and electrode 19 is directly opposite and approximately co-extensive with electrode 14. An electrically conducting connecting tab 21 is fixedly positioned on the surface 12, as by plating, and extends from contact with electrode 18 to the edge 13. The connecting tab 21 extends in a direction generally perpendicular the the X crystallographic axis and the direction of tab 16. A second electrically conducting connecting tab 22 is fixedly positioned in overlying relationship on the surface 12 and extends from electrical contact with the electrode 19 outwardly, generally perpendicular to the X crystallographic axis to the edge 13. The tabs 21 and 22 extend generally parallel and in spaced apart relationship. Further, the tabs 21 and 22 have the same configuration as the tabs 16 and 17 and approximately the same area and thickness. Thus, the electrodes 14, 15, 18, and 19 and the connecting tabs 16, 17, 21, and 22 on the surfaces 11 and 12 of the wafer 10 form a complete piezoelectric resonator or filter. As is well known by those skilled in the art, when a signal including the specific frequency of the device is applied between the connecting tabs 16 and 22, an output signal substantially composed of the specific frequency of the resonator will be available between the tabs 17 and 21. To avoid certain spurious responses or frequencies in the output, the crystal wafer 10 operating in the thickness shear mode, that exist in the device as thus far described are eliminated by the pseudo tabs plated on the wafer.

Referring to FIG. 1, a first pseudo tab 23 is fixedly positioned in overlying relationship on surface 11 approximately co-extensive with and directly opposite the connecting tab 22. A second pseudo tab 24 is fixedly positioned in overlying relationship on the surface 11 approximately co-extensive with and directly opposite the connecting tab 21. Both of the pseudo tabs 23 and 24 are spaced from the electrodes 14 and 15, respectively, by a certain distance so there is no electrical contact between the pseudo tabs 23 and 24 and the electrodes 14 and 15. The pseudo tabs 23 and 24 cover approximately the same area as the connecting tabs 21 and 22 (except for the spacing from the electrodes) and the thickness is approximately equal. In practice the electrodes 14 and 15, the connecting tabs 16 and 17, and the pseudo tabs 23 and 24 are plated onto the surface 11 simultaneously so that the thicknesses thereof are all similar. Further, in accordance, with well understood wave trapping criteria, the thickness of the material and area are related to the frequency of the unit so that spurious responses that propagate between the electrode pairs 14, 19 and 15, 18 will also propagate between tabs 22, 23 and 21, 24 when the area and thickness of each of the tabs is approximately equal to the area and thickness of each of the electrodes.

Referring to FIG. 2, a pair of pseudo tabs 25 and 26 are fixedly positioned in overlying relationship on the surface 12 generally co-extensive with and directly opposite the connecting tabs 17 and 16, respectively. The pseudo tabs 25 and 26 are spaced from the electrodes 18 and 22, respectively, by some distance so that there is no electrical contact between the pseudo tabs 25 and 26 and the electrodes 18 and 22. Further, the electrodes 18 and 19, the connecting tabs 21 and 22, and the pseudo tabs 25 and 26 will generally be plated onto the surface 12 simultaneously so that the thickness thereof will be similar (and generally similar to the tabs and electrodes on the surface 11). Hence, the areas of the pseudo tabs 25 and 26 will be approximately equal to the areas of the electrodes 18 and 19 and the connecting tabs 21 and 22 (except for the spacing between the ends of the tabs and the electrodes).

The spacing between the electrodes 14, 15 and 18, 19 is such that the main frequency mode propagates therebetween, while the spacing between the ends of the pseudo tabs 23, 24 and 25, 26 and the electrodes 14, 15 and 18, 19, respectively is greater. To prevent propagation of the main mode but permitting the propagation of spurious modes to the edge of the wafer.

The structure of the device as thus far described is essentially that as described in the U.S. Pat. No. 3,898,489 above referred to.

While the wafer as shown in this patent is circular in shape, that of the present invention is a segment of a circle which is defined by the chord 27. The total area of the wafer 10 according to the subject invention is, accordingly, substantially reduced in size and may be placed in a container or package of substantially reduced size.

Referring to FIG. 1, there is shown plated on the surface 11 of the wafer 10 an electrode 28 which has one portion lying adjacent the chord 27 and a second portion joined to the tab 16 along the edge 13.

Referring to FIG. 2, there is shown plated on the surface 12 of the wafer 10 an electrode 29 which has a portion lying adjacent the cord 27 and a portion joined to the pseudo tab 25. The electrodes 28 and 29, being disposed on opposite sides 11 and 12 of the wafer, have ends 31 and 32 which overlap each other. It is this area of overlap that forms the capacitor 33, also shown in FIGS. 3 and 4. While the electrode 29 is shown wider than the electrode 28 this is an expedient in order to limit the number of tolerances which need to be followed in manufacturing. The capacitance of the capacitor is defined, in essence, by the dimensions of the narrower electrode 28. Plated on the major surface 11 of the wafer 10 is a further electrode 34 which has one portion lying adjacent the chord 27 and has an end 35 terminating very close to the end of that portion of electrode 28 lying adjacent the chord 27 but not contacting the end. The electrode 34 also has a portion lying alongside the edge 13 and connected to the connecting tab 17. The electrode 34 lies opposite to the electrode 29 and except for the end 35 is essentially co-extensive therewith. Plated on the major surface 12 of the water 10 is a further electrode 36 which has one portion lying adjacent the chord 27 and has an end 37 terminating very close to the end of that portion of electrode 29 lying adjacent the cord 27 but not contacting the end. The electrode 36 also has a portion lying alongside the edge 13 and connected to the pseudo tab 26. The electrode 36 lies opposite to the electrode 28 and except for the end 37 is essentially co-extensive therewith. The electrodes 28, 29, 34 and 36 may be formed on the appropriate surfaces of the wafer at the same time that the other electrodes are formed thereon as will be understood.

The connecting tab 16 may be connected to the pseudo tab 26 as by plating, for example, along the edge 13 shown as the additional thickness 38 of FIGS. 1 and 2. Similarly, the connecting tab 17 may be connected to the pseudo tab 25 by an edge plating 39, the connecting 21 may be connected to the pseudo tab 24 by an edge plating 41 and the connecting tab 22 may be joined to pseudo tab 23 by an edge plating 42. The piezoelectric device as described, also, may be held in an appropriate holder around its edges, as is well understood, and the metallizations of the various connecting tabs and pseudo tabs joined to their respective counterparts by conductive cement, for example, not shown.

Referring to FIGS. 3 and 4 there are shown equivalent circuit diagrams representing typified versions of the crystal structure of FIGS. 1 and 2 with and without the application of the inventive principle. Thus, as is well understood in this art, that portion of the piezoelectric device represented by the electrodes 14 and 19 and the portion of the crystal material associated therewith is represented by the capacitor 43, resistor 44, inductor 45 and capacitor 46. Similarly, that portion of the piezoelectric device represented by the electrodes 15 and 18 and that part of the piezoelectric crystal associated therewith is represented by the capacitor 47, resistor 48, inductor 49 and capacitor 51. The inductive element 52 represents the coupling between the two sets of electrodes 14, 19 and 15, 18 through the material of the crystal operating in the thickness shear mode. The spacing between electrodes 14 and 15 (FIG. 1) and electrodes 18 and 19 (FIG. 2) is such that the coupling takes place through the material of the crystal as is well understood. The input to the piezoelectric device may be across tabs 16 and 22 and the output across tabs 17 and 21.

It is not believed necessary in this specification to elaborate upon the appropriateness of the circuit diagram as representative of the piezoelectric device, for example, a filter.

For improved response of the piezoelectric device a capacitor across the input and output terminals 16 and 17 is desired as has already been indicated and this capacitor 33 is formed according to the invention by the overlap of the ends of the electrodes 28 and 29. When the capacitor 33 is energized, as when the energization is available between terminals 16 and 17, the crystal material between the ends of electrodes 28 and 29 operates in the thickness shear mode in the same manner as the crystalline material between the main electrodes. That is, the material between the overlapping ends of electrodes 28 and 29 has wave energy therein, in the thickness shear mode, which wave energy tends to propagate throughout the material of the crystal in the same manner as wave energy coupling between the main electrodes. If the capacitor 33, formed by the overlapping electrodes 28 and 29, is sufficiently close to the electrodes 14, 15 and 18, 19 the energy within the capacitor 33 is coupled into the response of the main device, resonator, filter, or the like. Thus, the equivalent circuit of the device including the capacitor 33 includes the equivalent of a further resistor 53, inductor 54 and capacitor 55.

A typified frequency response for the circuit including the resistor 53, inductor 54 and capacitor 55 that represents a capacitor 33 disposed as to have its trapped wave energy coupled into the main electrode system will have a response illustrated by the solid line curve 56 which includes an extraneous or spurious spike 57 that is not desired. It is necessary that the energy trapped by the capacitor 33 represented by the overlapping portions of the ends of electrodes 28 and 29, be prevented from coupling into the main electrode system. That is to say, the equivalent circuit components 53, 54 and 55 should be eliminated so that the final circuit is that shown in FIG. 4 in which only the capacitor 33 is connected across the terminals 16 and 17. In other words, the presence of the components 53, 54 and 55 generate the undesired downward spike 57 in the response curve. The plating on, for example, the additional electrodes 34 and 36 having their ends 35 and 37, respectively, disposed closely adjacent to but not connected to the ends of the electrodes 28 and 29 causes the energy trapped within the capacitor 33 to be propagated between the electrodes 29 and 34 and between the electrodes 28 and 36 away from the capacitor 33 to the edge of the crystal 13 where it is no longer harmful. That is, the trapped wave energy of capacitor 33 is conducted to the edge of the crystal and dissipated there without entering into the main frequency mode of the device. At the edge the energy may be damped in the holding or clamping structure, not shown.

Since there is now no energy being coupled from the capacitor 33 to the electrodes 14 and 15 etc. the close proximity of the capacitor 33 to these electrodes does not affect the response of the device, for example a filter. This is equivalent to saying that the circuit branch 53, 54 and 58 is eliminated and the negative spike 57 correspondingly is eliminated leaving the response to be that shown by the dotted line 58 at the top of the spike 57. The equivalent circuit otherwise remains the same.

In actual devices, the distances between capacitor 33 as represented by the overlap of the ends of electrodes 28 and 29 from the electrodes 14, 15 etc., may be quite small. If this spacing is greater for example and about 70 mils there will be relatively insignificant coupling between the trapped energy of capacitor 33 and the main electrodes, but if the spacing is 50 mils or less there may be significant coupling, thereby requiring the subject invention.

The overall response shown by the curve 53 of FIG. 5 is believed to be well understood and not one requiring further elaboration in this specification except for that associated with the proximity effects of the capacitor 33 as already explained.

While a particular embodiment of the invention has been shown, it will be clear that there may be many other embodiments within its scope.

I claim:

1. A piezoelectric resonating device including:
   (a) a piezoelectric wafer having two major surfaces and a surrounding edge;
   (b) a pair of spaced apart electrodes on each of said two major surfaces, the electrodes of each of said pair is on opposite ones of said major surfaces being approximately co-extensive and providing a main frequency mode of operation including certain spurious modes of operation;
   (c) a pair of electrically conducting tabs fixedly positioned in overlying relationship on each of said major surfaces and extending, respectively, from electrical connection with respective ones of said electrodes on each of said respective major surfaces outwardly to the surrounding edge of the major surface, and conducting tabs of opposite ones of said major surfaces extending outwardly to the surrounding edge in different directions whereby substantially no portions thereof are directly opposite each other;
   (d) a pair of pseudo tabs positioned in overlying relationship on each of said major surfaces approximately coextensive with and directly opposite, respectively, each of said conducting tabs, said pseudo tabs being spaced from said electrodes a distance sufficient to allow propagation of the spurious modes between said conducting tabs and said pseudo tabs toward the outer edge of said wafer while decoupling said substantial propagation of the main mode, and
   (e) conducting means for connecting cooperating ones of said connecting tabs and said pseudo tabs on opposite ones of said major surfaces, comprising:
   a capacitor means including first and second capacitor plates, one on each one of said two major surfaces, said first and second capacitor plates comprise first and second metallic films formed on respective ones of said surfaces, the couplings between the first and second capacitor plates and the spaced apart electrodes comprise first and second connecting metallic films, respectively, formed on said surfaces,
   said first capacitor plate being coupled to one of said spaced apart electrodes and the second capacitor plate being coupled to the other one of said pair of electrodes,
   said capacitor means having main mode energy associated therewith and being disposed within the main mode energy coupling distance of said spaced apart electrodes,
   and means for preventing main mode trapped energy of said capacitor means from coupling into the resonating system of said spaced apart electrodes comprising third and fourth metallic films formed on the opposite surfaces of said piezoelectric plate and directly opposite to the first and second connecting metallic films, respectively, to the first and second capacitor plates, respectively, the ends of said third and fourth metallic films terminating close to said first and second capacitor plates, respectively, but not contacting them.

* * * * *